United States Patent [19]
Satoh et al.

[11] Patent Number: 5,089,863
[45] Date of Patent: Feb. 18, 1992

[54] FIELD EFFECT TRANSISTOR WITH T-SHAPED GATE ELECTRODE

[75] Inventors: Shinichi Satoh; Hiroji Ozaki; Takahisa Eimori, all of Hyogo, Japan

[73] Assignee: Mitsubishi Denki Kabushiki Kaisha, Tokyo, Japan

[21] Appl. No.: 242,116

[22] Filed: Sep. 8, 1988

[51] Int. Cl.$^5$ ............ H01L 29/10; H01L 23/48; H01L 29/04
[52] U.S. Cl. .................. 357/23.3; 357/68; 357/71; 357/59
[58] Field of Search ........... 357/23.3, 715, 65, 91, 357/59 I, 68

[56] References Cited

U.S. PATENT DOCUMENTS 4,476,482 10/1984 Scott .................. 357/715
4,845,534 7/1989 Fukuta ................. 357/15

FOREIGN PATENT DOCUMENTS 60-229374 11/1985 Japan ................. 357/233
63-44770 2/1988 Japan ................. 357/23.3
63-204772 8/1988 Japan ................. 357/22 I

OTHER PUBLICATIONS

Japanese J. of Appl. Physics: "Microfabrication Technique by Gas plasma Etching Method", by H. Komiya et al., vol. 15, p. 19 (1976).

*Primary Examiner*—Mark Prenty
*Attorney, Agent, or Firm*—Lowe, Price, Leblanc and Becker

[57] ABSTRACT

A field effect transistor comprises n type impurity regions formed spaced apart on a P type semiconductor substrate to be the source-drain regions and a T-shaped gate electrode formed on the region sandwiched by the n type impurity regions with an insulating film interposed therebetween, the gate electrode being formed of upper and lower two layers with the upper layer wider than the lower layer, wherein a n type channel region is formed between the source and the drain when the prescribed voltage is applied to the T-shaped gate electrode.

6 Claims, 8 Drawing Sheets

ION INJECTION

FIELD EFFECT TRANSISTOR WITH T-SHAPED GATE ELECTRODE

BACKGROUND OF THE INVENTION

1. Field of the Invention

The present invention relates generally to a field effect transistor and, more particularly, to a field effect transistor capable of high speed operation and to a manufacturing method therefor.

2. Description of the Prior Art

A field effect transistor (hereinafter referred to as FET) has been well known. FIGS. 1A to 1D show the manufacturing process of a conventional FET in a stepwise manner. A silicon oxide film 2a is formed on a P type semiconductor substrate. A silicon layer 3a or a layer of a conductive material such as a metal of high melting point is formed thereon (FIG. 1A). The polysilicon layer 3a and the silicon oxide film 2a are simultaneously etched by a known etching method, and a gate electrode 3 and a gate insulating film 2 are formed (FIG. 1B). A known etching method is disclosed in, for example, "Microfabrication Technique by Gas Plasma Etching Method" H. Komiya et al. Proc. of 7th Conference on Solid State Device 1975, Supplement to Japanese Journal of Applied Physics Vol. 15, p. 19 (1976). N type impurities are implanted from above the semiconductor substrate 1 using the gate electrode 3 as a mask. Thereafter, heat treatment is carried out. Consequently, N+ impurity layers 4a and 4b are formed on a main surface of the semiconductor substrate 1 in self alignment. The N+ impurity layers 4a and 4b constitute a source and a drain of a transistor (FIG. 1C). An Al wiring layer is formed connected to the N+ impurity layers (FIG. 1D). An enlarged view of the gate portion of the FET transistor structured as described above is shown in FIG. 2A. Since the N+ impurity layers 4a and 4b are formed by heat treatment, the impurities are diffused also in the transverse direction in accordance with the diffusion coefficient of the impurities. Consequently, an overlap portion is generated between the gate electrode 3 and the source-drain diffusion layers 4. The degree of overlap (the distance $\Delta L$) differs dependent on the type of impurities and on the temperature of heat treatment. An equivalent circuit of FIG. 2A is shown in FIG. 2B.

The overlapping portion ($\Delta L$) constitutes an additional capacitance between the gate and the source-drain as shown in the equivalent circuit of FIG. 2B. Therefore, if this MOS transistor is used in an integrated circuit or the like, the MOS transistor cannot operate at high speed and the power consumption of the MOS transistor becomes large. If the dimension of the overlapping portion becomes large, there will be a so-called short channel effect, causing problems such as the change of threshold voltage of the MOS transistor. Therefore, the overlapping portion is also an obstruction in reducing the size of the MOS transistor.

Besides the above described problem, a conventional FET has a problem of decrease of transconductance. The transconductance is one of the characteristics of the transistor, which means the proportion of the drain current to the gate voltage. FIG. 3 is a schematic diagram showing the electric field and the movement of electrons in a conventional FET. The drain is kept at a constant potential. A plane of equal potential is formed in the vicinity of the drain as shown in the figure. Therefore, an end portion of the drain has a high electric field. If a prescribed potential is applied to the gate of the transistor, a channel region is formed on a main surface of the semiconductor substrate between the source and the drain 4a and 4b, whereby electrons move from the source 4a to the drain 4b. When the electrons reach the high electric field region near the drain, the electrons receive large energy from the electric field, so that the electrons become hot electrons. The hot electrons generated in this manner are trapped near the gate insulating film sandwiched between the gate electrode and the drain region. Consequently, the surfaces of the drain and the channel region become liable to be inverted to the P type. Therefore, the concentration of the N type impurities becomes substantially low and the source resistance of the MOS transistor increases. Normally, when a constant voltage is applied to the gate electrode of the FET, a constant current flows. However, due to the above described reasons, a constant current does not flow even if a constant voltage is applied to the gate.

SUMMARY OF THE INVENTION

An object of the present invention is to provide a FET capable of high speed operation and a method for manufacturing the same.

Another object of the present invention is to provide a FET in which the transconductance is not degraded and a manufacturing method therefor.

A further object of the present invention is to provide a FET which can be highly integrated and a manufacturing method therefor.

A still further object of the present invention is to provide a FET in which any additional capacitance constituted by a gate electrode and the source-drain electrode is not generated and a manufacturing method therefor.

A still further object of the present invention is to provide a FET in which hot electron effect is not generated and a manufacturing method therefor.

A still further object of the present invention is to provide a FET having lightly doped drain (hereinafter referred to as LDD) structure in which the transconductance is not degraded and the manufacturing method therefor.

A still further object of the present invention is to provide a FET having LDD structure capable of high speed operation and a manufacturing method therefor.

The above described objects of the present invention can be attained by a FET comprising: a semiconductor substrate having a main surface and a predetermined impurity concentration of a certain conductivity type; an impurity layer having the opposite conductivity type formed spaced apart on the main surface of the semiconductor substrate, the impurity layer constituting a source-drain region and a region sandwiched by the impurity layers defining a channel region; and a T-shaped conductive layer whose upper layer portion being longer than the lower layer portion formed on the channel region with an insulating film interposed therebetween, the length of the lower layer portion being equal to or smaller than the length of the channel region.

Since the FET comprises a T-shaped conductive layer to be a gate electrode, the dimension of the overlapping portion between the source-drain region and the gate electrode can be minimized. Therefore, the capacitance constituted by the source-drain region and the gate electrode is minimized. Consequently, a FET can be provided which can operate at high speed and can be highly integrated.

Since the FET comprises a T-shaped gate electrode, the electrons existing below the eaves thereof generated by the hot electron effect can be neutralized. Consequently, a FET can be provided in which the transconductance is not degraded.

According to a preferred embodiment of the present invention, in the FET, the impurity layer comprises a first impurity layer having a first concentration and a second impurity layer having a second concentration which is higher than the first concentration; a region sandwiched by the first impurity layers constitute a first channel region, and a region sandwiched by the second impurity layers constitute a second channel region.

Since the FET is structured as described above, a FET having T-shaped electrode of LDD structure can be provided. Consequently, a transistor having LDD structure can be provided which is capable of high speed operation and in which the transconductance is not degraded.

According to a more preferred embodiment of the present invention, a method for manufacturing a FET comprises the steps of: preparing a semiconductor substrate having a main surface and a predetermined impurity concentration of a certain conductivity type; forming an insulating film on the main surface of the semiconductor substrate; forming a first layer on the insulating film; forming a second layer on the first layer; making the first layer narrower than the second layer to form a T-shaped by etching the first layer and the second layer; doping ions of the opposite conductivity type on the main surface of the semiconductor substrate to a first concentration by using the T-shaped layer as a mask; and heat treating the doped semiconductor substrate.

Since the manufacturing method of the FET comprises the above described steps, a FET having T-shaped gate electrode can be readily manufactured. Consequently, a method of manufacturing a FET capable of high speed operation and in which the transconductance is not degraded can be provided.

According to a more preferred embodiment of the present invention, the method of manufacturing the FET further comprises the following steps. Namely, forming side walls on one end surface and on the other end surface of the T-shaped layer by insulating layers, the length of the side wall on the main surface of the semiconductor substrate being longer than the second layer; doping ions of the opposite conductivity type on the main surface of the semiconductor substrate to a second concentration which is higher than the first concentration using the said T-shaped layer with side walls formed thereon as a mask; and heat treatment of the doped semiconductor substrate.

Since the method for manufacturing the FET comprises the above described steps, a method for manufacturing the FET of so-called LDD structure having a T-shaped electrode can be provided. Consequently, a method for manufacturing a transistor of LDD structure which is capable of high speed operation and in which the transconductance is not degraded can be provided.

These objects and other objects, features, aspects and advantages of the present invention will become more apparent from the following detailed description of the present invention when taken in conjunction with the accompanying drawings.

DESCRIPTION OF THE PREFERRED EMBODIMENT

Figure 4A:
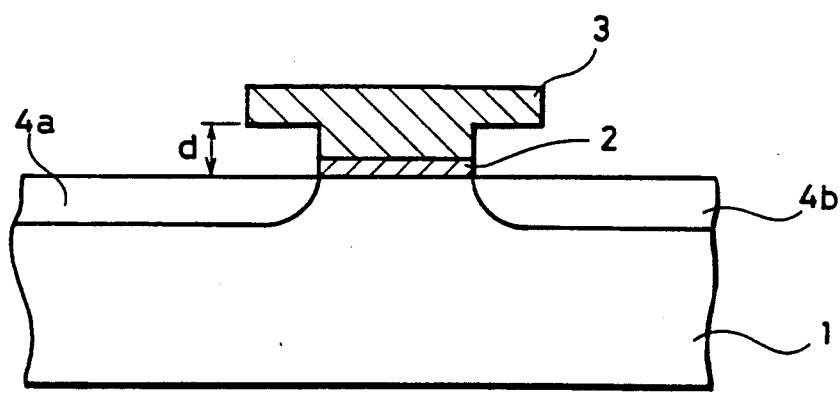
FIG. 4A shows the structure of a FET in accordance with the present invention.

FIG. 4A shows a sectional structure of a FET in accordance with the present invention. Referring to FIG. 4A, the FET in accordance with the present invention comprises a semiconductor substrate 1, a source region 4a and a drain region 4b formed on the main surface of the semiconductor substrate 1, and a T-shaped gate electrode formed on that portion of the main surface of the semiconductor substrate which is sandwiched by the source region 4a and the drain region 4b with an insulating film 2 interposed therebetween.

Figure 1A:
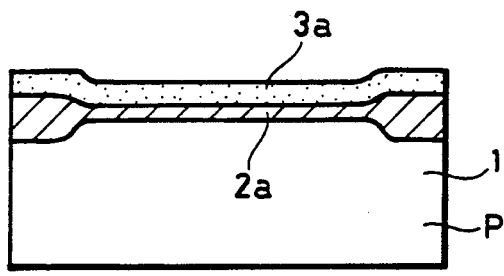
FIGS. 1A to 1D show the manufacturing method of a conventional FET in the stepwise manner.
Figure 1B:
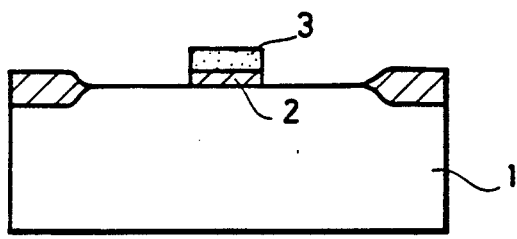
Figure 1C:
Figure 1C:
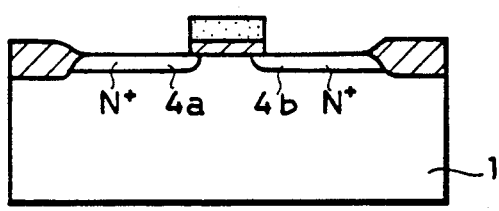
Figure 1D:
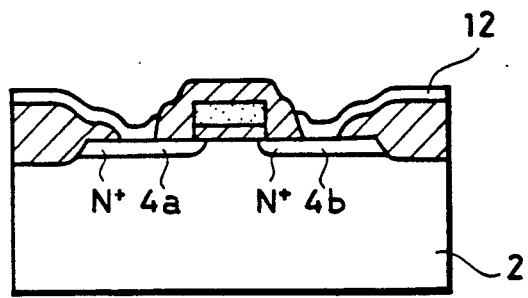
Figure 2A:
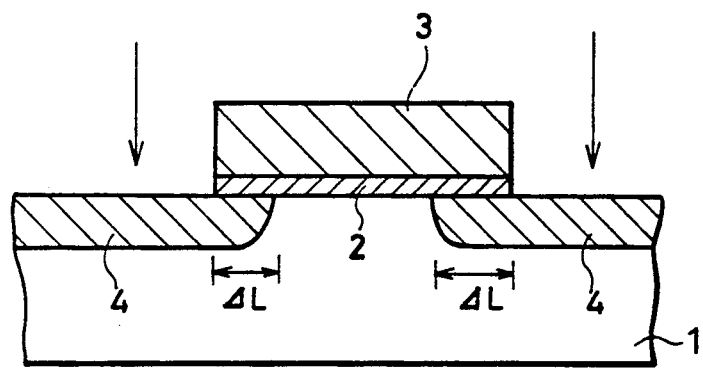
FIG. 2A is a diagram illustrating the additional capacitance existing in a conventional FET.
Figure 2B:
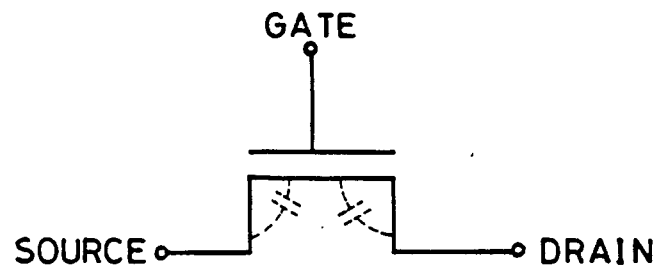
FIG. 2B is an equivalent circuit diagram of FIG. 2A.
Figure 3:
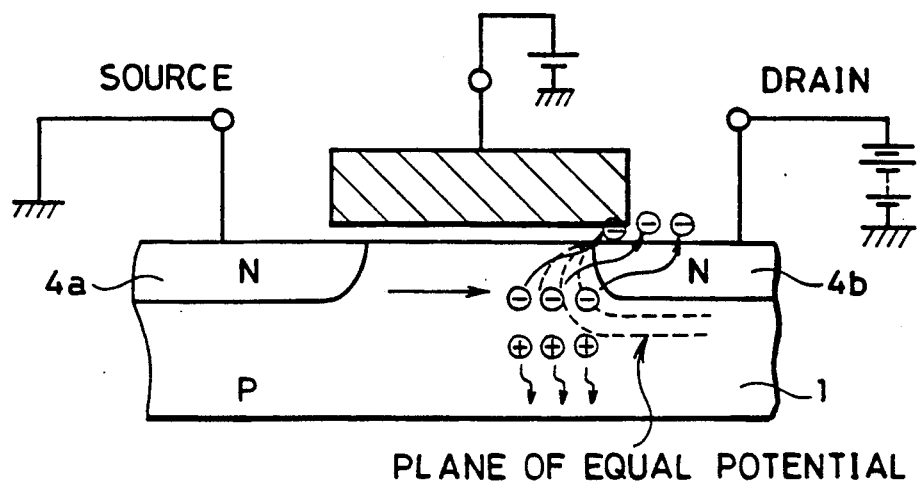
FIG. 3 illustrates hot electron effect.

The FET comprises a T-shaped gate electrode. Consequently, even if the impurity regions 4a and 4b are formed in self alignment by using the gate electrode as a mask, the end portions are not formed inside below the gate electrode. Since the distance d between the eaves of the T and the main surface of the semiconductor substrate (see FIG. 4A) is large enough not to form a capacitance. Therefore, any additional capacitance such as shown in FIG. 2B will not be generated. Consequently, a FET capable of high speed operation can be provided.

Figure 4B:
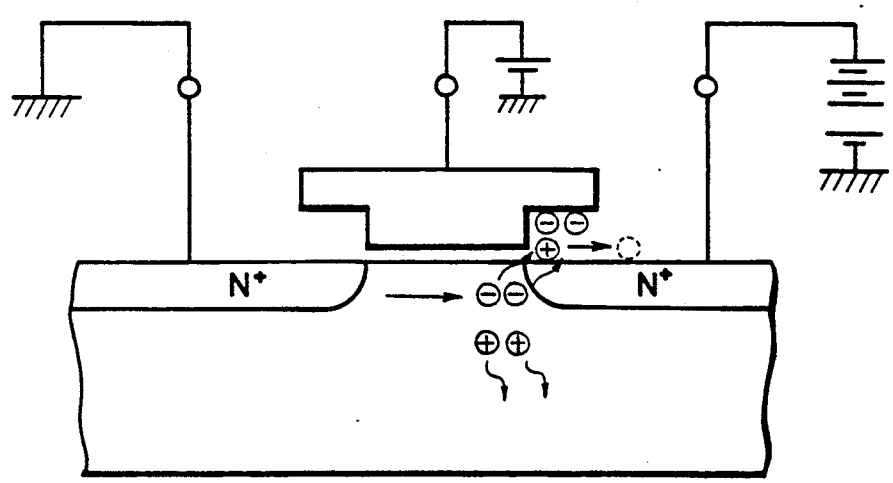
FIG. 4B illustrates the effect on the transconductance degradation of the FET in accordance with the present invention.

FIG. 4B illustrates the hot electron effect of the FET having the T-shaped gate electrode. Referring to FIG. 4B, the hot electrons generated by high electric field do not degrade the transconductance in the FET having the T-shaped gate electrode for the following reasons. Namely, when the FET is in operation, the T-shaped gate electrode is maintained at a prescribed potential. The electrons moved through the channel and turned to hot electrons by the high electric field to be trapped by the insulating film near the drain. However, since a positive potential is applied to the gate electrode as described above, the surface of the insulating film below the eaves of the T-shaped gate electrode has positive potential. Therefore, the trapped hot electrons are neutralized and the surfaces of the drain and the channel regions are not inverted to the P type. If a constant voltage is applied to the gate electrode, a prescribed current flows. Consequently, a FET can be provided in which the transconductance is not degraded.

Figure 5A:
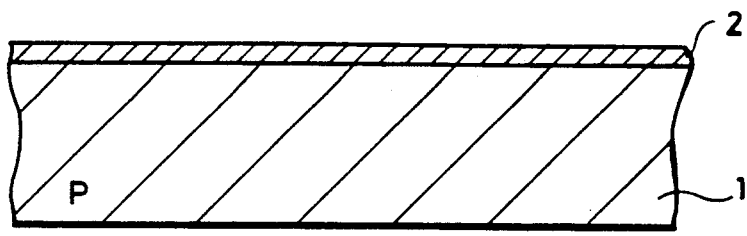
FIGS. 5A to 5F show in a stepwise manner the method for manufacturing the FET in accordance with the present invention.
Figure 5B:
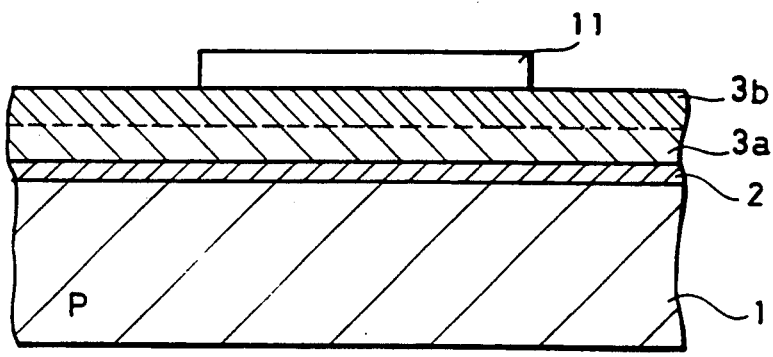
Figure 5C:
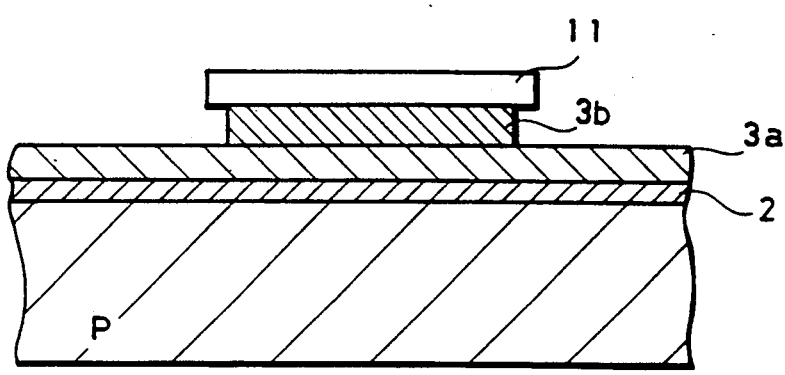
Figure 5D:
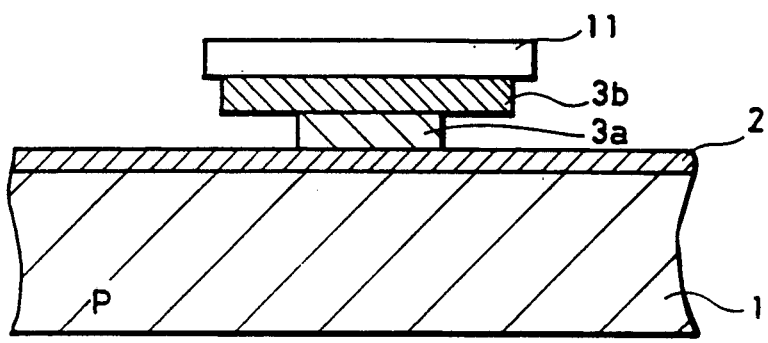
Figure 5E:
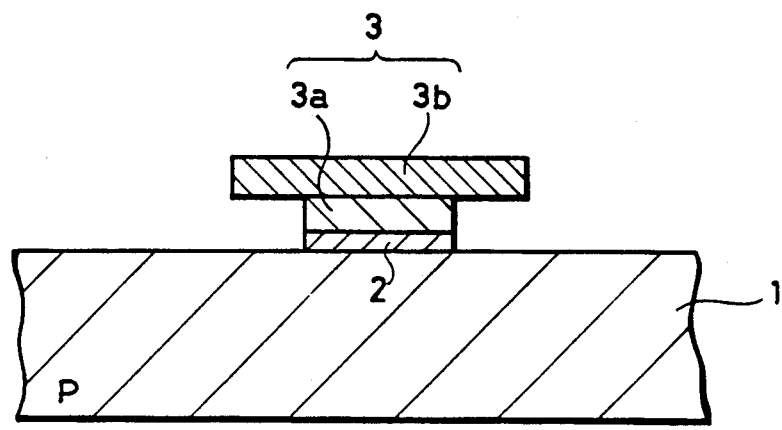
Figure 5F:
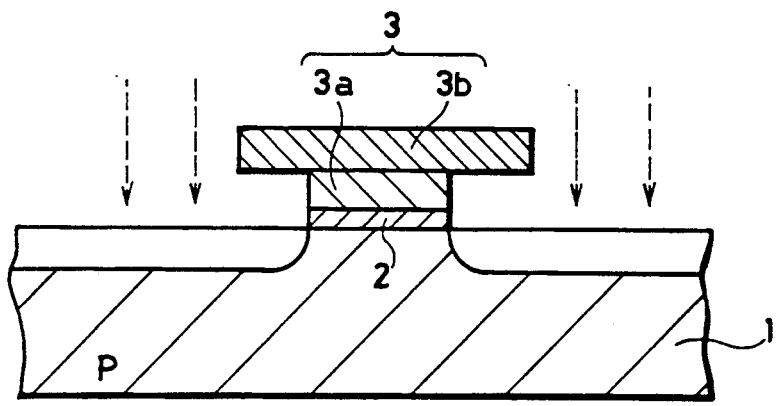

FIGS. 5A to 5F show in a stepwise manner a method for manufacturing a FET having the T-shaped gate electrode in accordance with the present invention. A P type semiconductor substrate 1 is prepared. A silicon oxide film 2 is formed on the main surface thereof (FIG. 5A). A polysilicon layer 3a is formed on the silicon oxide film 2 and a layer 3b of a metal having high melting point such as molybdenum silicon is formed thereon. A resist 11 is placed on a prescribed position on the molybdenum silicon layer. The polysilicon layer 3a and the molybdenum silicon layer 3b are etched by a known plasma etching method (FIG. 5B). The speed of etching of the polysilicon layer 3a and the molybdenum silicon layer 3b are different from each other even under the same etching condition. The etching speed of the polysilicon layer is approximately three times as fast as that of the molybdenum silicon layer. Consequently, the amount of etching of the polysilicon layer 3a in the transverse direction is less than the amount of etching of the molybdenum silicon layer 3b (FIG. 5C). Consequently, after a prescribed time period, a T-shaped gate electrode such as shown in FIG. 5D is formed. Preferable conditions of etching is, for example, as follows.

gas composition: carbon fluoride $CF_4$ (99%)+oxygen $O_2$ (1%)
power: radio frequency 20~200 W
gas pressure: 0.3~0.7 Torr The silicon oxide film 2 is removed except the portion below the gate electrode (FIG. 5E). After N type impurities are doped from above the substrate using the T-shaped gate electrode as a mask, the substrate is subjected to heat treatment of high temperature. Consequently, impurity diffused layers 4a and 4b which are to be the source-drain, respectively, are formed on the main surface of the substrate (FIG. 5F). The gate electrode is T-shaped. Therefore, no N type impurity region is formed below the T-shaped gate electrode. Consequently, a method for manufacturing a FET can be provided in which no additional capacitance is generated.

Description will be given of an example in which the FET having T-shaped gate electrode is applied to a transistor of LDD structure. A conventional transistor of LDD structure is shown in FIG. 6C. Referring to FIG. 6C, the conventional transistor having LDD structure comprises a P type semiconductor substrate 1, a gate electrode 3 formed on the main surface of the semiconductor substrate 1 with an insulating film interposed therebetween, a N type impurity diffused layer 4 of low concentration formed on the main surface of the semiconductor substrate, a N type impurity diffused layer 6 of high concentration, and side walls 5 formed on both sides of the gate electrode. Since the transistor of LDD structure has two impurity layers of low concentration and high concentration, the high electric field near the drain is weakened. Consequently, the hot electron effect can be suppressed. However, as in a common FET, the FET of LDD structure has the problems of additional capacitance, the degradation of transconductance, and the like.

Figure 6A:
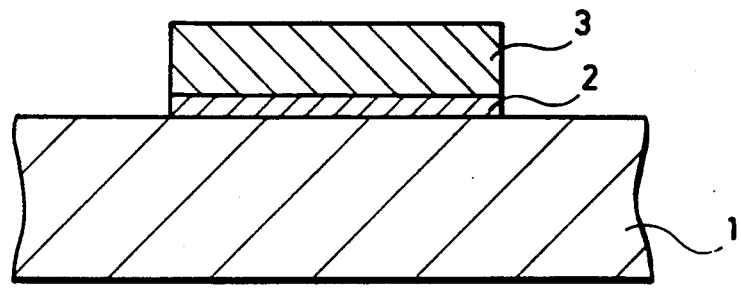
FIGS. 6A to 6C show in a stepwise manner the method for manufacturing a conventional FET having LDD structure.
Figure 6B:
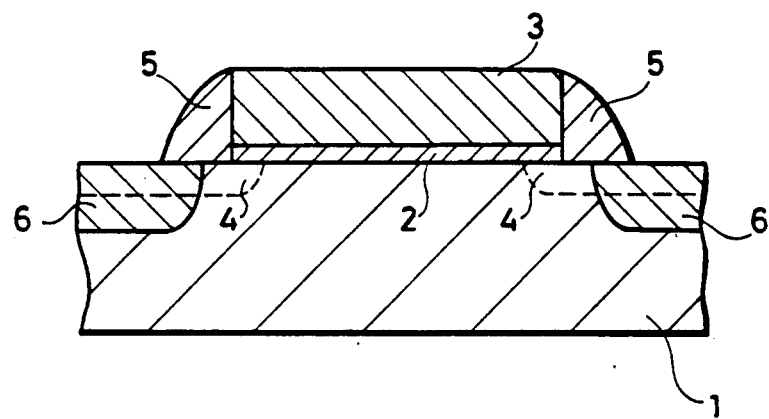
Figure 6C:
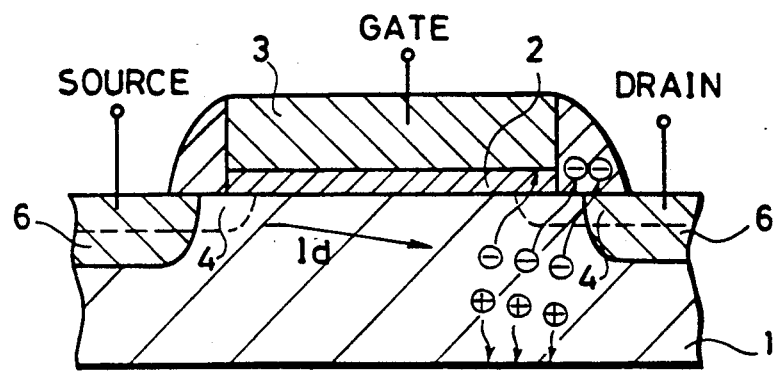

The method for manufacturing a conventional FET having the LDD structure is shown in FIGS. 6A to 6C. A gate electrode 3 is formed on a P type semiconductor substrate with an insulating film 2 interposed therebetween. The gate electrode is formed by processing conductive materials such as polycrystalline silicon or a metal of high melting point using a known method utilizing plasma reactance (FIG. 6A).

Impurities having conductivity type opposite to the substrate 1 is ion implanted on the main surface of the substrate 1 to the concentration of about $1 \times 10^{12}/cm^2$ to $1 \times 10^{14}/cm^2$. On this occasion, $N^-$ diffusion layers 4 are formed on both sides of the gate electrode 3 in self alignment using the gate electrode 3 as a mask.

An oxide film such as a silicon oxide film is formed on the main surface of the semiconductor substrate 1 and on the gate electrode 3 to a prescribed thickness. The oxide film is etched by a so-called anisotropic etching such as ion etching having directivity. Consequently, silicon oxide films called side walls 5 are formed on the side walls of the gate electrode 3. Impurities having conductivity type opposite to the substrate 1 is ion implanted to a high concentration (no less than $1 \times 10^{14}/cm^2$) using the side walls 5 and the gate electrode 3 as masks, and heat treatment is carried out at high temperature. Consequently, activated source-drain diffused layers 6 are formed (FIG. 6C). The high concentration source-drain diffused layers 6 are formed in self alignment by using the side walls 5 as masks, so that the layers are formed outer than the impurity diffused layers of low concentration.

The conventional FET having the LDD structure is manufactured in the above described manner. Therefore, the conventional method comprises problems such as increase of steps for forming side walls, difficulty in controlling the width of the side walls.

Figure 7A:
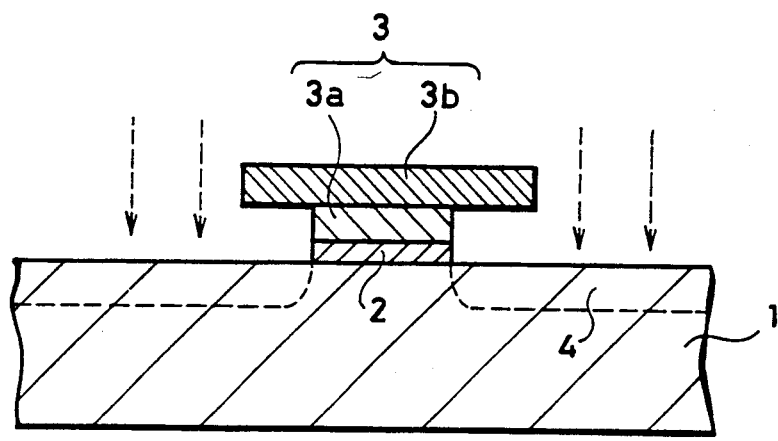
FIGS. 7A to 7C show in a stepwise manner the method for manufacturing the FET having LDD structure in accordance with the present invention.
Figure 7B:
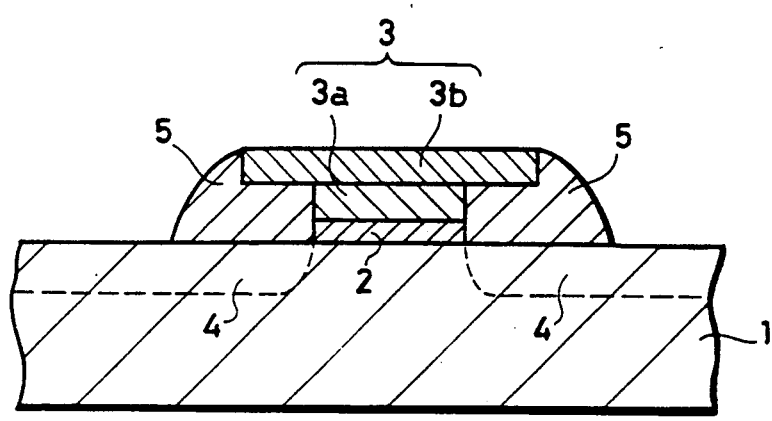
Figure 7C:
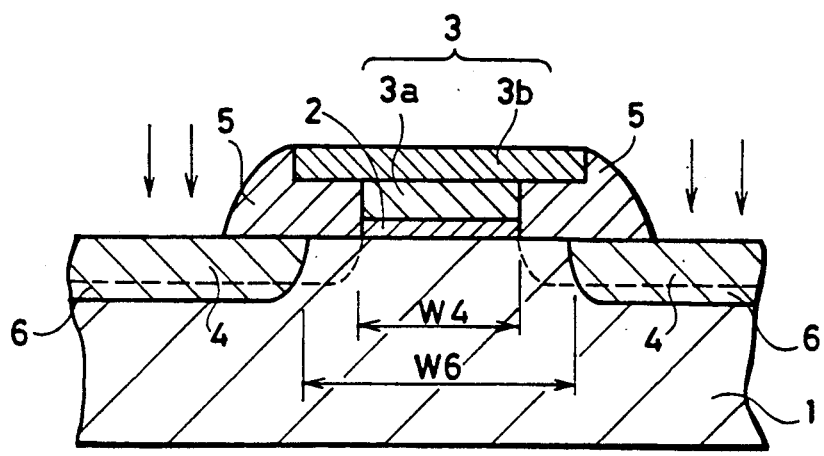

A method for manufacturing a FET of LDD structure utilizing the FET having T-shaped gate electrode in accordance with the present invention is shown in FIGS. 7A to 7C. The processes until the T-shaped gate electrode is formed on the semiconductor substrate 1 with an insulating film interposed therebetween are the same as those shown in FIGS. 5A to 5E.

Impurities having conductivity type opposite to the substrate 1 are ion implanted to a low concentration ($1 \times 10^{12}/cm^2$ to $1 \times 10^{14}/cm^2$) from above the substrate by a known ion implantation technique using the gate electrode 3 as a mask. The substrate 1 is heat treated and low concentration source-drain diffused layers 4 are formed with the end portions thereof approximately aligned with the ends of the portions of the gate electrode 3 on the side of the substrate (FIG. 7A).

Thereafter, an insulating film such as a silicon oxide film is formed on the main surface of the substrate 1, on the side walls 5 and on the gate electrode 3 to a prescribed thickness. A so-called anisotropic etching such as ion etching having directivity is carried out on the entire surface to form silicon oxide films called side walls 5 on the side walls of the gate electrode 3 (FIG. 7B).

Thereafter, impurities having conductivity type opposite to the substrate 1 are ion implanted to a high concentration (more than $5 \times 10^{14}/cm^2$) on the entire surface using the said gate electrode 3 and the side walls 5 as masks. By the heat treatment of the substrate, high concentration source-drain diffused layers 6 are formed (FIG. 7C). On this occasion, the high concentration source-drain diffused layers 6 are formed continuous to the low concentration source-drain diffused layers 4. The distance W4 between ends of the low concentration source-drain diffused layers 4 are made narrower than the distance W6 between ends of the high concentration source-drain diffused layers 6. Consequently, a double diffusion structure is provided.

The FET manufactured by the above described method comprises source-drain diffused layers of double diffusion structure consisted by low concentration diffused layer and high concentration diffused layers. Consequently, the electric field is weakened near the drain, whereby the generation of hot carriers can be suppressed. Even if the generated hot carriers are trapped in the insulating film 5, the negative potential of the electrons in the insulating film can be neutralized as described above, and consequently, the problem of degradation of transconductance due to the high resistance of the low concentration impurity layer 4 can be prevented. Since the end of the above described low concentration impurity layer 4 is approximately aligned with the end of the gate electrode 3, an additional capacitance is hardly generated.

The present invention can be applied to the N type or P type MOS transistors and, it can be applied to MOS transistors formed not only on the single substrate but on an epitaxial substrate or on a wafer. In either case, the same effect as described in the above embodiment can be obtained. The present invention is also applied to a compound semiconductor besides the silicon semiconductor.

Figure 8:
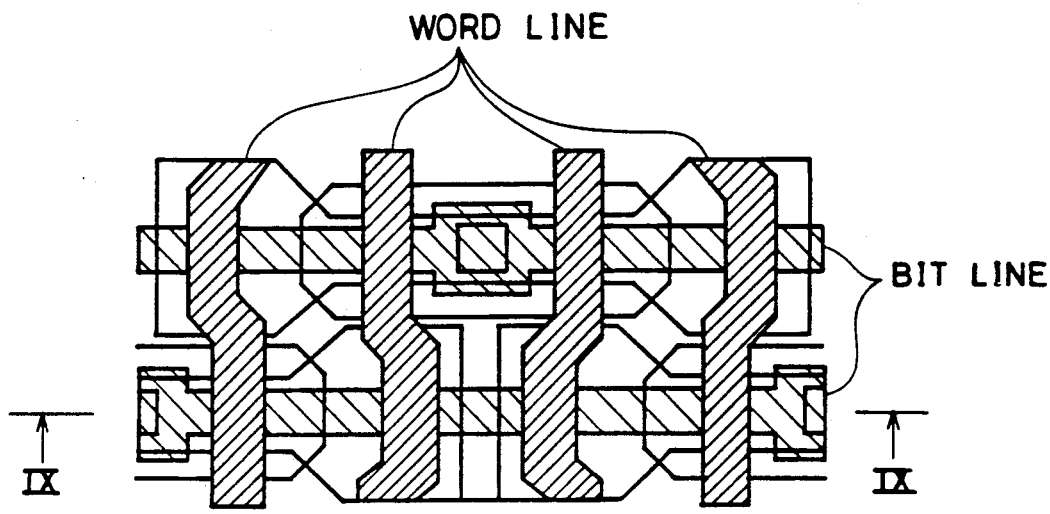
FIG. 8 is a plan view of a semiconductor memory device to which the FET of the present invention is applied.
Figure 10:
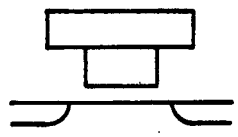
FIG. 10 is a partial enlarged view of FIG. 9.
Figure 9:
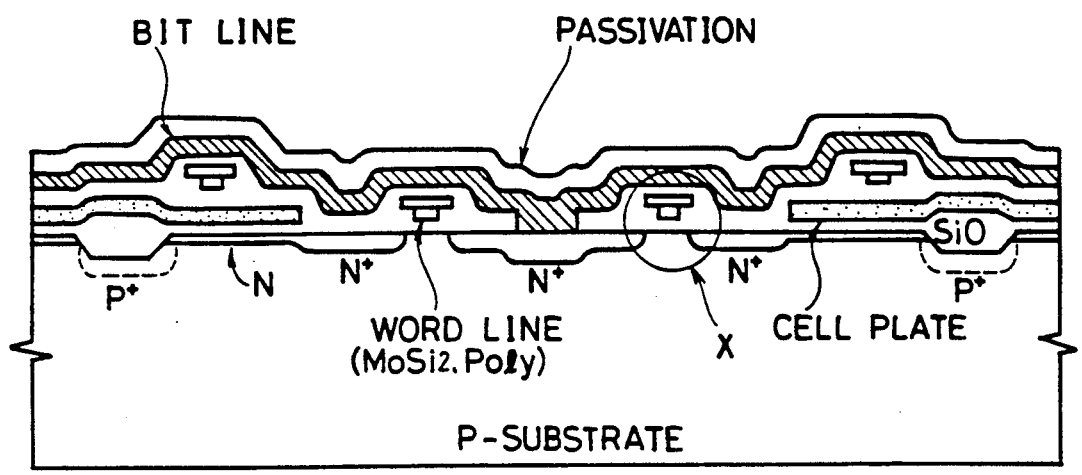
FIG. 9 is a cross sectional view taken along the line IX—IX of FIG. 8.

A semiconductor memory device to which the FET in accordance with the present invention is applied will be explained. FIG. 8 is a plan view of a semiconductor memory device to which the FET of the present invention is applied. FIG. 9 is a cross sectional view taken along the line IX—IX of FIG. 8. FIG. 10 is a partial enlarged view of the part designated by an arrow X in FIG. 9.

Referring to FIGS. 8 to 10, the FET of the present invention can be easily incorporated with a semiconductor memory device. Accordingly, a semiconductor memory device whose operation speed is high can be easily provided.

In the FET in accordance with the present invention, the length of the channel region is longer than the length of the lower layer portion of the T-shaped gate electrode formed thereon, so that there is no overlapping portion between the lower layer portion of the gate electrode and the source-drain regions. Therefore, there will be no additional capacitance. Consequently, the speed of operation is increased. The potential in the upper layer portion of the T-shaped gate electrode neutralizes the electrons trapped therebelow, whereby the transconductance is not degraded.

In accordance with the method for manufacturing the FET of the present invention, the T-shaped gate electrode is consisted by upper and lower layers each of which, is formed of different materials, so that the gate electrode can be formed at one time under the same condition by anisotropic etching as shown in FIG. 5D. Therefore, the manufacturing can be carried out easily.

As described above, the FET in accordance with the present invention comprises a T-shaped gate electrode preferably consisting of upper and lower layers and source-drain regions having a channel region whose length is equal to or wider than the length of the lower layer of the T-shaped gate electrode. Consequently, a FET can be provided which is capable of high speed operation, in which the transconductance is not degraded and which can be manufactured easily.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A field effect transistor comprising:
   a semiconductor substrate having a main surface and a predetermined impurity concentration of a first conductivity type;
   impurity layers of a second conductivity type formed spaced apart at the main surface of the semiconductor substrate, said impurity layers constituting source-drain regions, and a region between said impurity layers defining a channel region at said main surface; and
   a T-shaped conductive layer formed on said channel region with an insulating film interposed therebetween at said main surface, said T-shaped conductive layer having an upper layer portion longer than a lower layer portion,
   wherein said upper layer portion and said lower layer portion are different materials, the material of said lower layer portion having a higher etching rate than the material of said upper layer portion.

2. A field effect transistor according to claim 1, wherein said upper layer portion comprises a metal of high melting point.

3. A field effect transistor according to claim 2, wherein said metal of high melting point comprises a molybdenum silicide.

4. A field effect transistor comprising:
   a semiconductor substrate having a main surface and a predetermined impurity concentration of a first conductivity type;
   impurity layers of a second conductivity type formed spaced apart at the main surface of the semiconductor substrate, said impurity layers constituting source-drain regions, and a region between said impurity layers defining a channel region at said main surface; and
   a T-shaped conductive layer formed on said channel region with an insulating film interposed therebetween at said main surface, having an upper portion longer than a lower portion, the length of said lower portion being substantially equal to the length of said channel region, wherein
   each of said impurity layers comprises a first impurity layer portion having a first impurity concentration and a second impurity layer portion having a second impurity concentration which is higher than the first impurity concentration,
   said channel region is defined by a first distance between said first impurity layer portions and by a second distance between said second impurity layer portions, and
   said upper portion and said lower portion are formed of different materials.

5. A field effect transistor comprising:
   a semiconductor substrate having a main surface and a predetermined impurity concentration of a first conductivity type;
   impurity layers of a second conductivity type formed spaced apart at the main surface of the semiconductor substrate, said impurity layers consisting source/drain regions, and a region between said impurity layers defining a channel region; and
   a T-shaped conductive layer formed on said channel region with an insulating film interposed therebetween at said main surface, said T-shaped conductive layer having an upper layer portion longer than a lower layer portion, said upper and lower layer portions formed of different materials which are chosen such that said material of said lower layer portion can be etched at a greater rate than said material of said upper layer portion during a common etching process.

6. A field effect transistor according to claim 5, wherein said material of said upper layer portion comprises molybdenum silicide.

* * * * *